(12) United States Patent
Sawada et al.

(10) Patent No.: US 8,530,911 B2
(45) Date of Patent: Sep. 10, 2013

(54) SEMICONDUCTOR LIGHT EMITTING MODULE AND IMAGE READER USING THE SAME

(75) Inventors: Hideki Sawada, Kyoto (JP); Kuniaki Nakamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 606 days.

(21) Appl. No.: 12/266,098

(22) Filed: Nov. 6, 2008

(65) Prior Publication Data

US 2009/0127569 A1    May 21, 2009

(30) Foreign Application Priority Data

Nov. 8, 2007 (JP) ................................. 2007-290665
Jan. 24, 2008 (JP) ................................. 2008-013605

(51) Int. Cl.
*H01L 33/00* (2010.01)
(52) U.S. Cl.
USPC ............ 257/89; 257/82; 257/91; 257/E33.066
(58) Field of Classification Search
USPC .................... 257/82, 89, 91, E33.066
See application file for complete search history.

(56) References Cited

U.S. PATENT DOCUMENTS

| | | | |
|---|---|---|---|
| 6,268,600 B1 * | 7/2001 | Nakamura et al. | 250/216 |
| 2005/0231983 A1 * | 10/2005 | Dahm | 362/800 |
| 2009/0219586 A1 * | 9/2009 | Fujimoto et al. | 358/494 |

FOREIGN PATENT DOCUMENTS

| | | | |
|---|---|---|---|
| JP | 2007-78916 | | 3/2007 |
| WO | WO/2007/099838 | * | 9/2007 |
| WO | WO 2007/099838 | * | 9/2007 |

* cited by examiner

*Primary Examiner* — Zandra Smith
*Assistant Examiner* — Jamie C Niesz
(74) *Attorney, Agent, or Firm* — Hamre, Schumann, Mueller & Larson, P.C.

(57) ABSTRACT

A semiconductor light emitting module is provided with a supporting conductor including a die bonding pad, and with a plurality of semiconductor light emitting elements bonded to the die bonding pad. The semiconductor light emitting elements are arranged in series along an arrangement line extending in a first direction. The die bonding pad includes a portion overlapping alternative die-bonding positions which are symmetrical to positions of the bonded semiconductor light emitting elements with respect to a line of symmetry extending in a second direction different from the first direction.

11 Claims, 7 Drawing Sheets

SEMICONDUCTOR LIGHT EMITTING MODULE AND IMAGE READER USING THE SAME

BACKGROUND OF THE INVENTION

1. Field of the Invention

The present invention relates to a semiconductor light emitting module including e.g. LED chips for emitting red light, green light and blue light. The invention also relates to an image reader using such a semiconductor light emitting module.

2. Description of the Related Art

Figure 8:
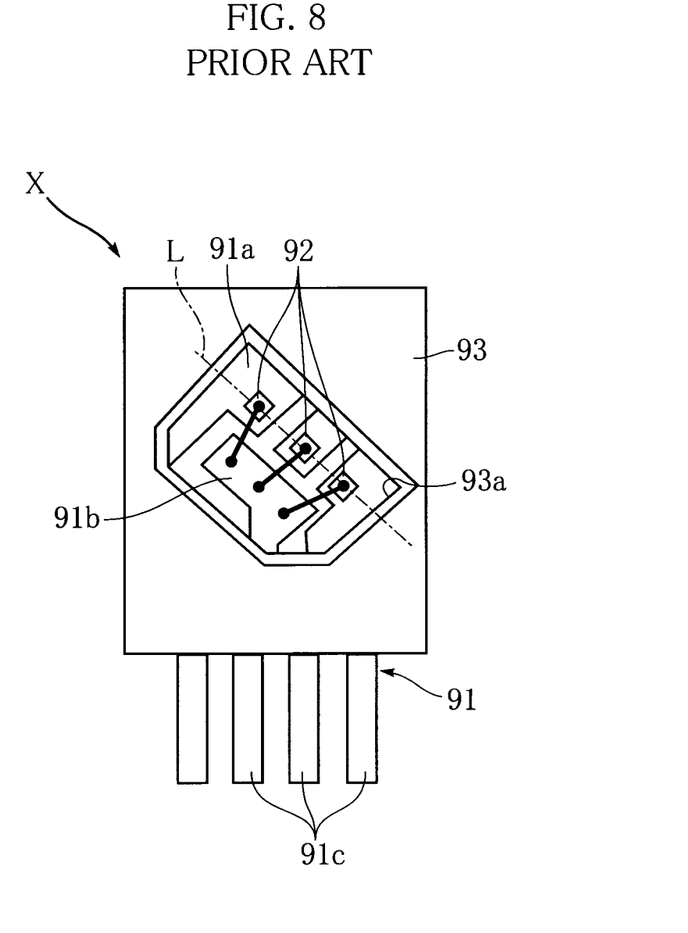
FIG. 8 is a front view showing an example of conventional semiconductor light emitting module.

FIG. 8 shows a conventional semiconductor light emitting module (see JP-A-2007-78916). The illustrated semiconductor light emitting module X includes a lead 91, three LED chips 92 and a resin package 93. The lead 91 is utilized for supplying power to the LED chips 92 and includes a die bonding pad 91a, a wire bonding pad 91b and terminals 91c. The die bonding pad 91a comprises three lands. The LED chips 92 are bonded to the lands, respectively. The three LED chips 92 emit red light, green light and blue light, respectively. Each of the LED chips 92 is connected to the wire bonding pad 91b via a wire. The terminals 91c are utilized for connecting the semiconductor light emitting module X to a circuit board for mounting to an image reader, for example. The resin package 93 is made of e.g. white resin and partially covers the lead 91. The resin package 93 is formed with an opening 93a. The opening 93a exposes the three LED chips 92.

When the semiconductor light emitting module X is used for an image reader, a light guiding member is arranged to face the semiconductor light emitting module X. The light guiding member is in the form of an elongated bar and is so arranged that one of its end surfaces faces the LED chips 92. The light enters the light guiding member through the end surface and is reflected in the width direction while traveling in the longitudinal direction. Thus, from the light guiding member, linear light extending in the longitudinal direction is emitted. The linear light illuminates the object to be read such as a document. The light reflected by the object is received by e.g. sensor IC chips, whereby the content of the document is read as image data.

To obtain proper image data, it is necessary to illuminate the document uniformly with linear light having a high intensity. To achieve this, it may be sometimes necessary to change the arrangement of the LED chips 92. However, when the arrangement of the LED chips 92 is changed, the shape and arrangement of the die bonding pad 91a also need to be changed. This causes an increase in the cost for manufacturing the semiconductor light emitting module and the image reader.

SUMMARY OF THE INVENTION

The present invention has been proposed under the circumstances described above. It is therefore an object of the present invention to provide a semiconductor light emitting module and an image reader in which the position of the semiconductor light emitting elements can be changed appropriately.

According to a first aspect of the present invention, there is provided a semiconductor light emitting module comprising: a supporting conductor including a die bonding pad; and a plurality of semiconductor light emitting elements bonded to the die bonding pad. The semiconductor light emitting elements are arranged in series along an arrangement line extending in a first direction. The die bonding pad includes a portion overlapping alternative die-bonding positions which are symmetrical to the positions of the bonded semiconductor light emitting elements with respect to a line of symmetry extending in a second direction different from the first direction.

With the above arrangement, the semiconductor light emitting elements can be arranged in a selected one one of two lines that are symmetrical with respect to the line of symmetry. Thus, even when the structure of an image reader is changed, the semiconductor light emitting module can still be used without changing the original structure of the die bonding pad by selecting one of the two arrangement lines. Consequently, the cost for manufacturing the semiconductor light emitting modules can be prevented from increasing.

Preferably, the die bonding pad includes a plurality of lands to which the semiconductor light emitting elements are bonded, respectively. The lands include an arcuate land which is centered on the intersection of the arrangement line and the line of symmetry or a circular land which overlaps the intersection. With this arrangement, the semiconductor light emitting elements can be arranged along selected one of the arrangement lines extending in various directions between the above-described arrangement line and another arrangement line that are symmetrical with respect to the line of symmetry.

Preferably, the supporting conductor includes a lead that constitutes the die bonding pad. The lead includes an extension that extends freely (i.e., without touching the remaining portion of the lead) from one of the lands. With this arrangement, by holding the extension in manufacturing the semiconductor light emitting module, the land is prevented from becoming unstable.

Preferably, the die bonding pad comprises a single land overlapping all the positions of the bonded semiconductor light emitting elements and the alternative die-bonding positions. With this arrangement, the semiconductor light emitting elements can be located close to each other. This promotes the mixing of red light, green light and blue light, and hence, is advantageous for emitting clear white light.

According to a second aspect of the present invention, there is provided an image reader comprising: a semiconductor light emitting module in accordance with the first aspect of the present invention; an elongated transparent light guiding member having a first end and a second end, and further having a light incident surface facing the semiconductor light emitting module, a reflective surface extending in the longitudinal direction of the light guiding member and a light emitting surface extending in the longitudinal direction and located opposite to the reflective surface; and a light receiving unit for receiving light reflected by an object to be read.

Preferably, the light incident surface is provided at the first end of the light guiding member. In addition, the image reader may further comprise an additional semiconductor light emitting module in accordance with the first aspect, where the additional semiconductor light emitting module is arranged to face the second end of the light guiding member. With such an arrangement, the luminance of the linear light emitted from the light guiding member is enhanced, and the luminance distribution is made uniform.

Other features and advantages of the present invention will become more apparent from detailed description given below with reference to the accompanying drawings.

DETAILED DESCRIPTION OF THE PREFERRED EMBODIMENTS

Preferred embodiments of the present invention will be described below with reference to the accompanying drawings.

Figure 1:
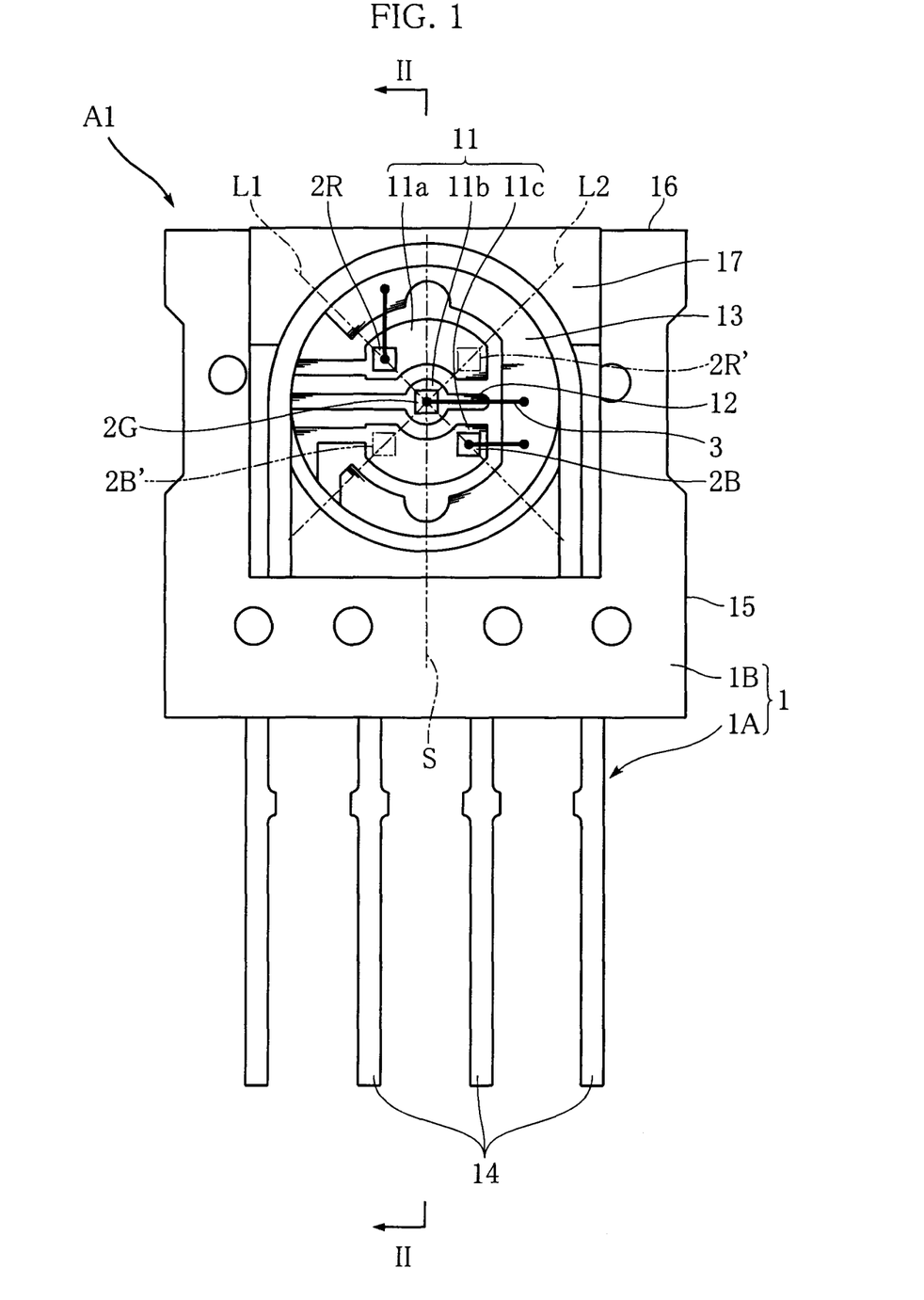
FIG. 1 is a front view showing a semiconductor light emitting module according to a first embodiment of the present invention.
Figure 2:
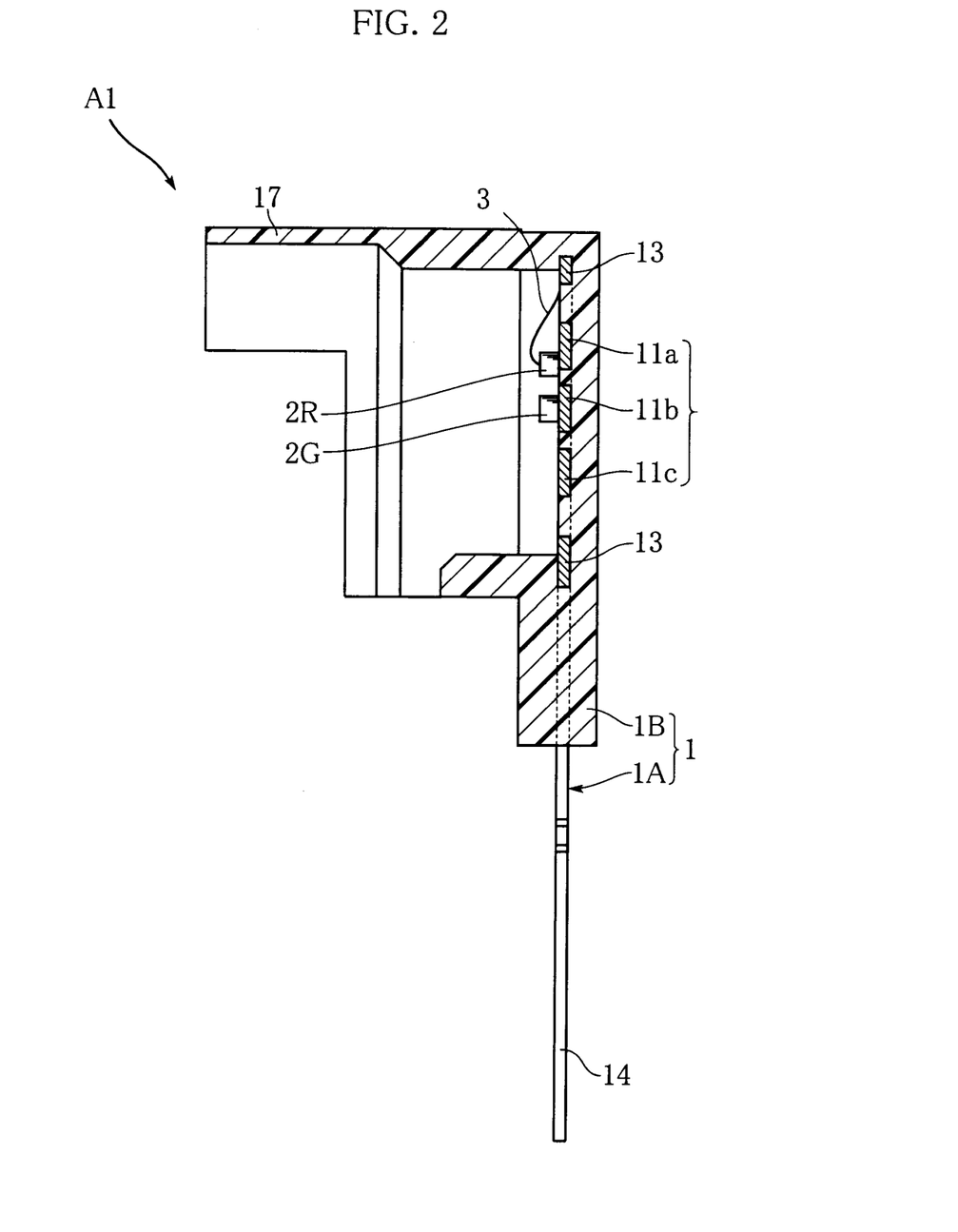
FIG. 2 is a sectional view taken along lines II-II in FIG. 1.

FIGS. 1 and 2 a semiconductor light emitting module according to a first embodiment of the present invention. The semiconductor light emitting module A1 of this embodiment includes a supporting conductor 1, LED chips 2R, 2G, 2B and wires 3. The semiconductor light emitting module A1 can be used as a light source of an image reader, as will be described later.

The supporting conductor 1 serves to support the LED chips 2R, 2G and 2B and electrically connect the LED chips 2R, 2G and 2B to an external electric circuit (not shown). In this embodiment, the supporting conductor 1 comprises a lead 1A and a resin package 1B.

The lead 1A may is made of e.g. an alloy of Cu or Ni and includes a die bonding pad 11, an extension 12, a wire bonding pad 13 and a plurality of terminals 14. The die bonding pad 11 is utilized for bonding the three LED chips 2R, 2G and 2B and comprises three lands 11a, 11b and 11c. The land 11b is generally circular and positioned at a substantial center of the semiconductor light emitting module A1. The lands 11a and 11c are arranged to sandwich the land 11b. Each of the lands 11a and 11c is generally arcuate and comprises part of a same circle centered on an intersection point of lines L1, L2 and S, which will be described later. The extension 12 extends from the land 11b. The end of the extension 12 is not connected to any of the lands 11a, 11C and the wire bonding pad 13.

The wire bonding pad 13 is generally C-shaped and surrounds the die bonding pad 11. Respective one ends of the three wires 3 are bonded to the wire bonding pads 13. The other end of each wire 3 is bonded to the LED chip 2R, 2G or 2B. The terminals 14 project from the resin package 1B in parallel with each other. The terminals 14 are used for connecting the semiconductor light emitting module A1 to e.g. a circuit board.

The resin package 1B is made of e.g. white resin and partially covers the lead 1A. The resin package 1B includes edges 15 and 16 extending perpendicularly to each other. The resin package 1B is formed with a hood 17. The hood 17 may be utilized for properly positioning a light guiding member 4 of an image reader B, which will be described later. The hood 17 is open to expose the LED chips 2R, 2G, 2B and the die bonding pad 11.

Each of the LED chips 2R, 2G and 2B includes e.g. an active layer, and an n-type semiconductor layer and a p-type semiconductor layer sandwiching the active layer. The LED chips 2R, 2G and 2B emit red light, green light and blue light, respectively. The LED chips 2R, 2G and 2B of this embodiment are of the one-wire type and formed with a cathode at the bottom surface and an anode at the upper surface. The LED chips 2R, 2G and 2B are bonded to the lands 11a, 11b and 11c, respectively. The cathodes are electrically connected to the die bonding pad 11. The wires 3 are bonded to the anodes. As shown in FIG. 1, the LED chips 2R, 2G and 2B are aligned along an arrangement line L1.

In this embodiment, the arrangement line L1 is inclined by approximately 45 degrees with respect to both of the edges 15 and 16. The arrangement line L2 is a line which is symmetrical to the arrangement line L1 with respect to the line S extending in parallel with the edge 15. Now, the positions on the arrangement line L2 which are symmetrical to the die-bonding positions of the LED chips 2R and 2B with respect to the line S are defined as alternative (or reserve) die-bonding positions 2R' and 2B'. The LED chip 2G is located on the line of symmetry S, so that the alternative die-bonding position for the LED chip 2G corresponds to the die-bonding position of the LED chip 2G itself. As shown in FIG. 1, the land 11a overlaps both of the die-bonding position of the LED chip 2R and the alternative die-bonding position 2R'. Similarly, the land 11c overlaps both of the die-bonding position of the LED chip 2B and the alternative die-bonding position 2B'. The direction in which the arrangement line L1 extends is the first direction of the present invention, whereas the direction in which the line of symmetry S extends is the second direction of the present invention.

Figure 3:
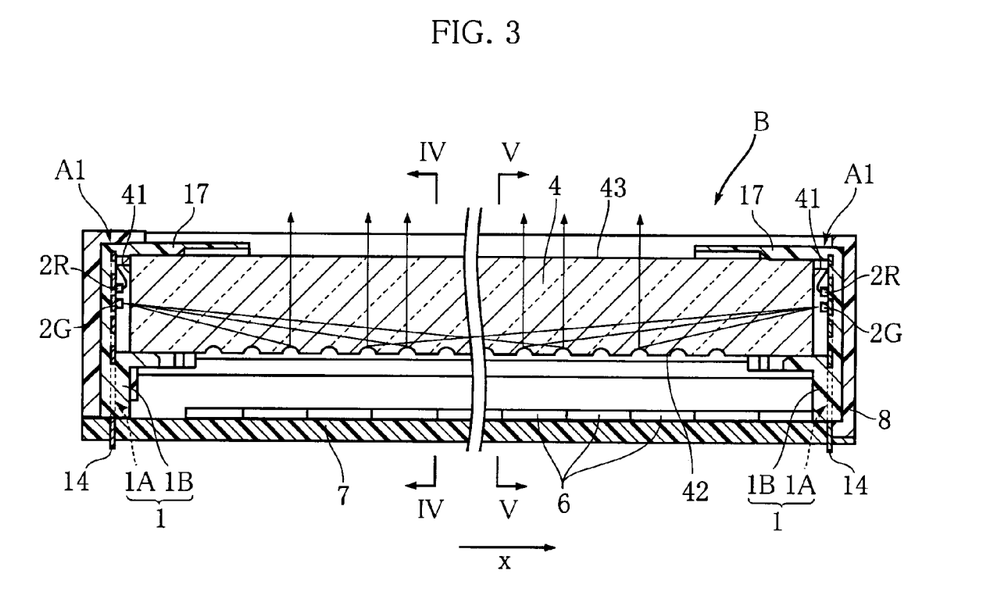
FIG. 3 is a sectional view showing a principal portion of an image reader according to the present invention.
Figure 4:
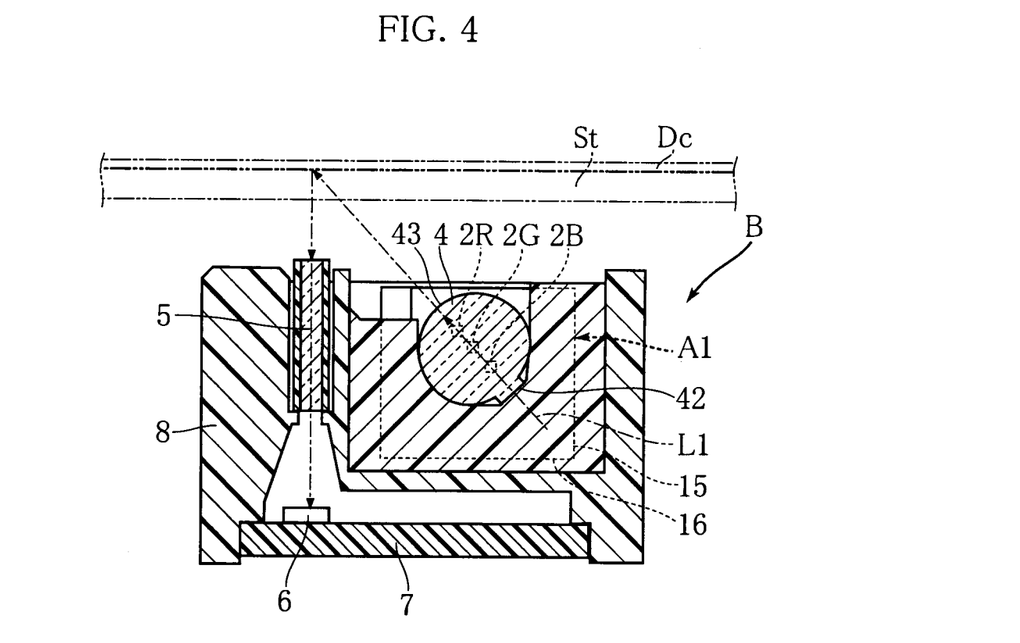
FIG. 4 is a sectional view taken along lines IV-IV in FIG. 3.
Figure 5:
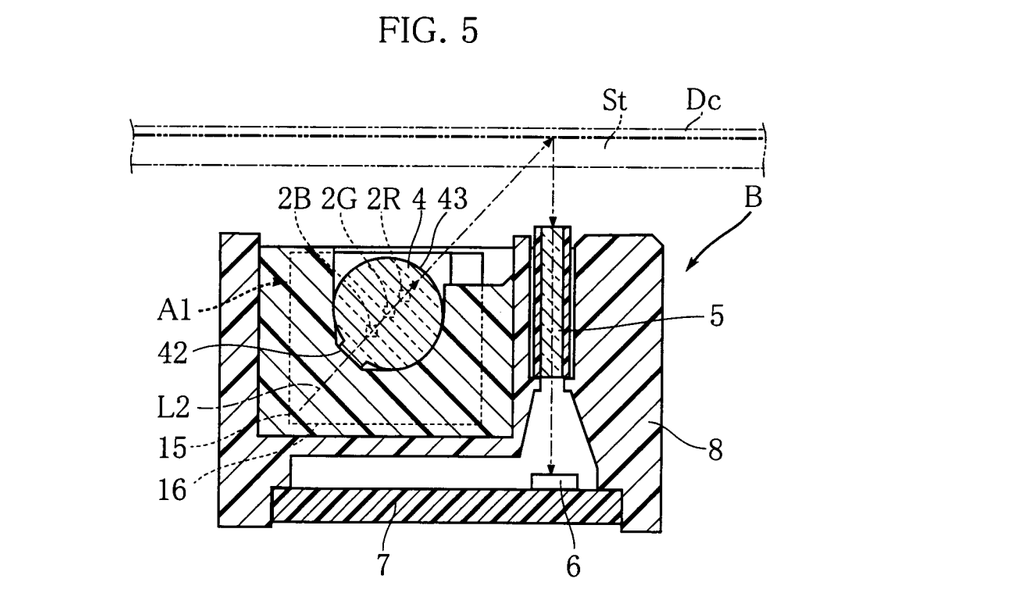
FIG. 5 is a sectional view taken along lines V-V in FIG. 3.

FIGS. 3-5 show an example of image reader according to the present invention. The image reader B of this embodiment includes two semiconductor light emitting modules A1. The image reader B further includes a light guiding member 4, a lens unit 5, a plurality of sensor IC chips 6, a substrate 7 and a case 8. As shown in FIGS. 4 and 5, the image reader B is designed to illuminate a document Dc placed on a document table St with linear light to read the content of the document Dc as image data.

The light guiding member 4 is made of e.g. an acrylic resin such as PMMA (polymethyl methacrylate) and has a high transparency. In this embodiment, the light guiding member has a circular cross section. The light guiding member 4 includes two light incident surfaces 41, a reflective surface 42 and a light emitting surface 43. The light incident surfaces 41 comprise the end surfaces of the light guiding member 4. The ends of the light guiding member 4 are fitted in the hoods 17 of the two semiconductor light emitting modules A1. With this arrangement, the light incident surfaces 41 face the semiconductor light emitting modules A1, respectively.

FIG. 4 is a sectional view of the image reader as viewed toward the semiconductor light emitting module A1 positioned on the left side in FIG. 3. As shown in this figure, the direction in which the arrangement line L1 extends corresponds to the direction from the reflective surface 42 toward the light emitting surface 43. That is, the LED chips 2R, 2G and 2B arranged along the arrangement line L1 are aligned in the direction from the reflective surface 42 toward the light emitting surface 43.

FIG. 5 is a sectional view of the image reader as viewed toward the semiconductor light emitting module positioned on the right side in FIG. 3. In this figure, the direction in which the arrangement line L2 extends corresponds to the direction from the reflective surface 42 toward the light emitting surface 43. Unlike the semiconductor light emitting module A1 shown in FIG. 4, the LED chips 2R, 2G and 2B in this semiconductor light emitting module A1 are arranged along the arrangement line L2. This semiconductor light emitting module A1 is obtained by bonding the LED chips 2R and 2B on the alternative die-bonding positions 2R' and 2B' shown in FIG. 1, respectively.

The reflective surface 42 reflects the light traveling from the light incident surface 41 in the longitudinal direction of the light guiding member 4 toward the light emitting surface 43. The reflective surface 42 may be formed with a plurality of grooves. The light emitting surface 43 is a surface for emitting the light toward the document Dc and extends in the longitudinal direction. From the light emitting surface 43, a linear light extending in the longitudinal direction is emitted.

The lens unit 5 converges the light reflected by the document Dc onto the sensor IC chips 6 to form a non-inverted non-magnified image. Each of the sensor IC chips 6 comprises a semiconductor chip including a light receiving portion (not shown) and is mounted on the substrate 7. The sensor IC chip 6 has a photoelectric conversion function and outputs an image signal of the level corresponding to the received amount of light. The substrate 7 is made of e.g. a ceramic material such as alumina or aluminum nitride or glass-fiber-reinforced epoxy resin and in the form of an elongated rectangle. The substrate 7 is mounted at an appropriate position of the case 8 by fitting the substrate 7 to the lower end of the case 8. The case 8 is made of a synthetic resin and accommodates the substrate 7, the semiconductor light emitting modules A1, the sensor IC chip 6, the light guiding member 4 and the lens unit 5.

The advantages of the semiconductor light emitting module A1 and the image reader B will be described below.

According to this embodiment, the LED chips 2R, 2G and 2B can be arranged along at least either of the arrangement lines L1 and L2. Thus, even when two semiconductor light emitting modules A1 are to be arranged at the ends of the light guiding member 4 of an image reader B, it is not necessary to prepare two different leads 1A. As a result, the cost for manufacturing the semiconductor light emitting module A1 and the image reader B is prevented from increasing.

Since the lands 11a and 11c have a shape comprising part of a same circle, it is possible to arrange the LED chips 2R, 2G and 2B along another arrangement line defined between the arrangement lines L1 and L2. Fr instance, by arranging the LED chips 2R, 2G and 2B along an appropriate arrangement line defined between the arrangement lines L1 and L2, the portion at which the document Dc is to be illuminated with linear light in the image reader B can be adjusted as desired.

Generally, in manufacturing the semiconductor light emitting module A1, the resin package 1B is molded using a die. In this molding process, the land 11b extending like a branch tends to become unstable. However, by performing the molding with the extension 12 pressed against part of the mold with e.g. a pin, the resin package 1B can be formed with the land 11b kept stable. When the extension 12 is pressed against the mold with a pin, resin does not flow behind the extension 12. As a result, the extension 12 may be unstable as compared with the land 11b behind which resin flows. However, sine the LED chips 2R, 2G, 2B or the wires 3 are not bonded to the extension 12, the bonding work is not hindered.

In the image reader B, the light emitted from the semiconductor light emitting module A1 enters from each end of the light guiding member 4. With this arrangement, the luminance of the linear light emitted from the light guiding member is enhanced, and the luminance distribution in the longitudinal direction is made uniform.

Figure 6:
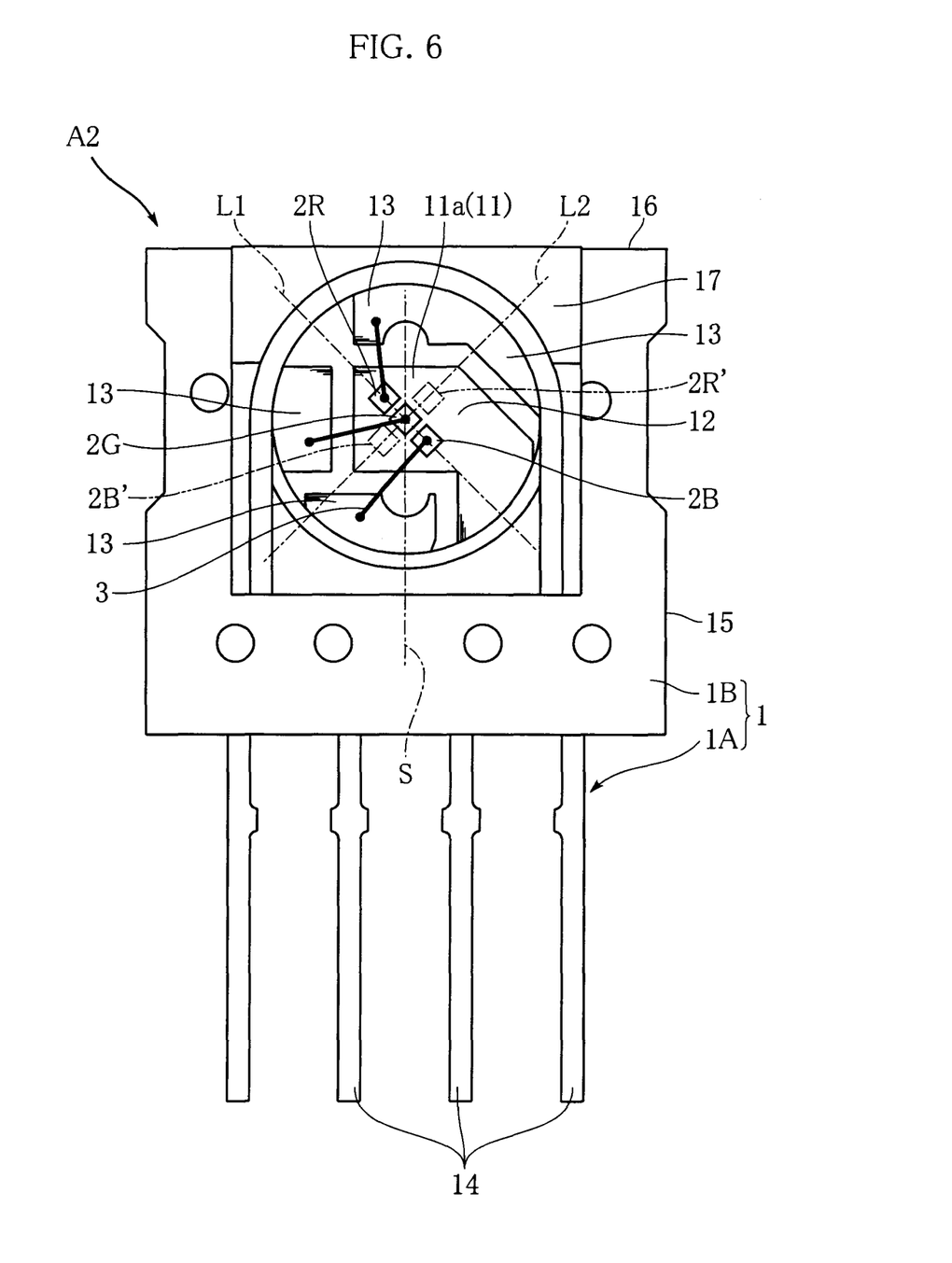
FIG. 6 is a front view showing a semiconductor light emitting module according to a second embodiment of the present invention.

FIG. 6 shows a semiconductor light emitting module according to a second embodiment of the present invention. The semiconductor light emitting module A2 of this embodiment differs from that of the foregoing embodiment in structure of the die bonding pad 11. In this figure, the elements which are identical or similar to those of the foregoing embodiment are designated by the same reference signs as those used for the foregoing embodiment.

In this embodiment, the die bonding pad 11 comprises a single land 11a. The land 11a is generally rectangular and overlaps all of the die-bonding positions of the LED chips 2R, 2G, 2B and alternative die bonding positions 2R', 2B'. All the LED chips 2R, 2G and 2B are bonded to the land 11a. Three wire bonding pads 13 are arranged around the land 11a. A wire 3 is bonded to each of the wire bonding pads 13.

In this embodiment again, it is possible to arrange the LED chips 2R, 2G and 2B along either one of the arrangement lines L1 and L2. Thus, the cost for manufacturing the semiconductor light emitting module A2, and hence, the cost for manufacturing e.g. an image reader using the semiconductor light emitting module A2 are prevented from increasing. Moreover, according to this embodiment, it is possible to arrange the LED chips 2R, 2G and 2B relatively close to each other. This is suitable for properly mixing red light, green light and blue light emitted from the LED chips 2R, 2G and 2B to emit clear white light.

Figure 7:
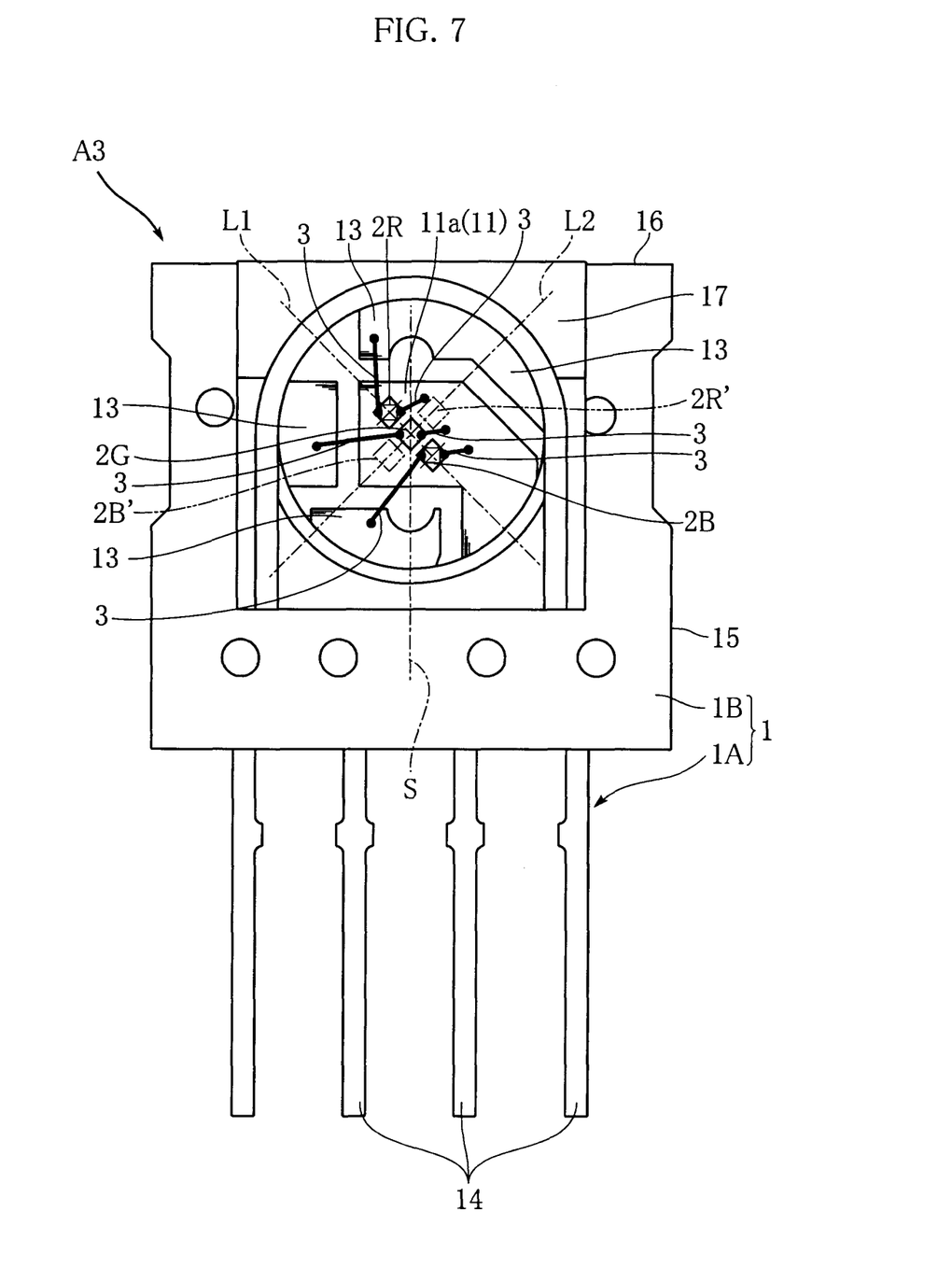
FIG. 7 is a front view showing a semiconductor light emitting module according to a third embodiment of the present invention.

FIG. 7 shows a semiconductor light emitting module according to a third embodiment of the present invention. The semiconductor light emitting module A3 of this embodiment differs from those of the foregoing embodiments in structure of the LED chips 2R, 2G and 2B. In this figure, the elements which are identical or similar to those of the foregoing embodiments are designated by the same reference signs as those used for the foregoing embodiments.

In this embodiment, the die bonding pad 11 comprises a single land 11a. As shown in FIG. 7, the LED chips 2R, 2G and 2B are bonded to the land 11a along the arrangement line L1. The land 11a is generally rectangular and overlaps all of the die-bonding positions of the LED chips 2R, 2G, 2B and alternative die bonding positions 2R', 2B'.

Each of the LED chips 2R, 2G and 2B of this embodiment is of the two-wire type and formed with a cathode and an anode at the upper surface. Wires 3 are bonded to the cathode and the anode, respectively. Three wires 3 are bonded to the die bonding pad 11. Each of the anodes is electrically connected to the die bonding pad 11 via a wire 3. Three wire bonding pads 13 are arranged around the land 11a. The wires 3 are bonded to the wire bonding pads 13. The cathodes are electrically connected to the wire bonding pads 13 via wires 3. According to this embodiment again, the same advantages as those described above are obtained.

The semiconductor light emitting module and the image reader according to the present invention are not limited to the foregoing embodiments. The specific structure of each part of the semiconductor light emitting module and the image reader may be varied in design in many ways.

The supporting conductor of the present invention is not limited to one comprising a lead and a resin package. For instance, the supporting conductor may comprise a substrate made of an insulating material and a wiring pattern formed on the substrate. In this case, the die bonding pad and the land for constituting the die bonding pad may be provided by the wiring pattern. The semiconductor light emitting elements of the present invention is not limited to those for emitting red light, green light and blue light. For instance, semiconductor light emitting elements for emitting visible light, infrared light or ultraviolet light may be appropriately employed. Further, the image reader of the present invention is not limited to one including two semiconductor light emitting modules like the foregoing embodiment. For instance, the image reader may include a single semiconductor light emitting module provided at one end of the light guiding member. Instead of the semiconductor light emitting module A1, the semiconductor light emitting module A2 or A3 may be used for the image reader.

The invention claimed is:

1. An image reader comprising:
   a semiconductor light emitting module;
   an elongated transparent light guiding member having a first end and a second end, the light guiding member including a light incident surface facing the semiconductor light emitting module, a reflective surface extending in a longitudinal direction of the light guiding member and a light emitting surface extending in the longitudinal direction and located opposite to the reflective surface; and
   a light receiving unit for receiving light reflected by an object to be read;
   the semiconductor light emitting module comprising:
   a supporting conductor including a die bonding pad;
   first, second and third die-bonding positions located on the die bonding pad;
   first, second and third alternative die-bonding positions located on the die bonding pad;
   first, second and third semiconductor light emitting elements selectively bonded to the first, the second and the third die-bonding positions on the die bonding pad, respectively, or, alternatively, bonded to the first, the second and the third alternative die-bonding positions on the die bonding pad, respectively; and
   a pattern for wire-bonding, the pattern being disposed adjacent to the die bonding pad,
   wherein the first, the second and the third die-bonding positions are disposed in series along an arrangement line extending in a first direction, the second die-bonding position being disposed between the first die-bonding position and the third die-bonding position,
   wherein the first, second and third die-bonding positions and the first, the second and the third alternative die-bonding positions are symmetrical to each other with respect to a line of symmetry extending in a second direct different from the first direction, the second die-bonding position being located at the line of symmetry,
   wherein when the first, the second and the third semiconductor light emitting elements are bonded to the first, the second and the third die-bonding positions on the die bonding pad, respectively, at least one of the first, the second and the third alternative die-bonding positions is not bonded with a semiconductor light emitting element,
   wherein when the first, the second and the third semiconductor light emitting elements are bonded to the first, the second and the third alternative die-bonding positions on the die bonding pad, respectively, at least one of the first, the second and the third die-bonding positions is not bonded with a semiconductor light emitting element, and
   wherein the light guiding member has a light emitting direction parallel to the first direction when the first, second and third semiconductor light emitting elements are bonded to the first, the second and the third die-bonding positions on the die bonding pad, respectively.

2. The image reader according to claim 1, wherein the light incident surface is provided at the first end of the light guiding member.

3. The image reader according to claim 2, further comprising an additional semiconductor light emitting module comprising:
   a supporting conductor including a die bonding pad; and
   a plurality of semiconductor light emitting elements bonded to the die bonding pad;
   wherein the semiconductor light emitting elements are disposed in series along an arrangement line extending in the first direction; and
   wherein the die bonding pad includes a portion overlapping alternative die-bonding positions which are symmetrical to positions of the bonded semiconductor light emitting elements with respect to a line of symmetry extending in the second direction different from the first direction;
   the additional semiconductor light emitting module being disposed to face the second end of the light guiding member.

4. The image reader according to claim 1, wherein the supporting conductor comprises a resin hood into which one of the first end and the second end of the light guiding member is fitted.

5. The image reader according to claim 1, wherein the light emitting direction of the light guiding member proceeds from the reflective surface toward the light emitting surface of the light guiding member.

6. The image reader according to claim 1, wherein the die bonding pad includes a first land, a second land and a third land, to which the first, the second and the third semiconductor light emitting elements are bonded, respectively; and
   Wherein the lands include an arcuate land or a circular land, the arcuate land being centered on an intersection of the arrangement line and the line of symmetry, the circular land overlapping the intersection.

7. The image reader according to claim 6, wherein the supporting conductor includes a lead constituting the die bonding pad, the lead including an extension extending from one of the lands.

8. The image reader according to claim 1, wherein the die bonding pad comprises a single land overlapping all the positions of the first, the second and the third semiconductor light emitting elements and the alternative die-bonding positions.

9. The image reader according to claim 6, wherein the alternative die-bonding position corresponding to the first semiconductor light emitting element is located on the first land to which the first semiconductor light emitting element is bonded, and the alternative die-bonding position corresponding to the third semiconductor light emitting element is located on the third land to which the third semiconductor light emitting element is bonded.

10. The image reader according to claim 1, wherein the die bonding pad includes only three semiconductor light emitting elements.

11. The image reader according to claim 1, wherein the second die-bonding position serves as the second alternative die-bonding position.

* * * * *